United States Patent
Lee et al.

(10) Patent No.: US 6,661,039 B1
(45) Date of Patent: Dec. 9, 2003

(54) VELOCITY-COOLED HOT-ELECTRON BOLOMETRIC MIXER/DETECTOR

(75) Inventors: Mark Lee, Berkeley Heights, NJ (US); Loren Neil Pfeiffer, Morristown, NJ (US); Kenneth William West, Mendham, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 125 days.

(21) Appl. No.: 09/861,055

(22) Filed: May 18, 2001

(51) Int. Cl.$^7$ .................................. H01L 31/072
(52) U.S. Cl. ............... 257/201; 257/194; 257/192; 257/183; 257/189; 257/20; 257/24; 257/195; 438/285; 438/590; 438/60
(58) Field of Search ................. 257/194, 192, 257/201, 183, 189, 20, 24, 195; 438/205, 590, 60

(56) References Cited

U.S. PATENT DOCUMENTS 5,516,725 A * 5/1996 Chang et al. ............ 438/572
5,895,929 A * 4/1999 Abrokwah et al. ........ 257/20
6,002,860 A   12/1999 Voinigescu et al.

OTHER PUBLICATIONS

K.S. Yngvesson, "Ultrafast two-dimensional electron gas detector and mixer for terahertz radiation," Applied Physics Letters, vol. 76, No. 6, pp. 777–779 (Feb. 7, 2000).

* cited by examiner

Primary Examiner—Tom Thomas
Assistant Examiner—Junghwa Im

(57) ABSTRACT

A hot-electron bolometric mixer/detector, which uses the nonlinearities of the heated two-dimensional electron gas medium, is described. Electrons in the illustrative embodiment of the present invention are "velocity-cooled" rather than "diffusion-cooled" or "phonon-cooled" like hot-electron bolometric mixer/detectors in the prior art. The illustrative embodiment is velocity-cooled when the elastic mean-free path of the electrons is greater than the channel length, L, of the mixer/detector. In this case, the motion of the hot electrons is more accurately modeled by their speed rather than in accordance with diffusion models. This leads to a mixer/detector with a wider modulation bandwidth at a lower power than is exhibited by mixer/detectors in the prior art.

28 Claims, 9 Drawing Sheets

END VIEW ALONG CUT I

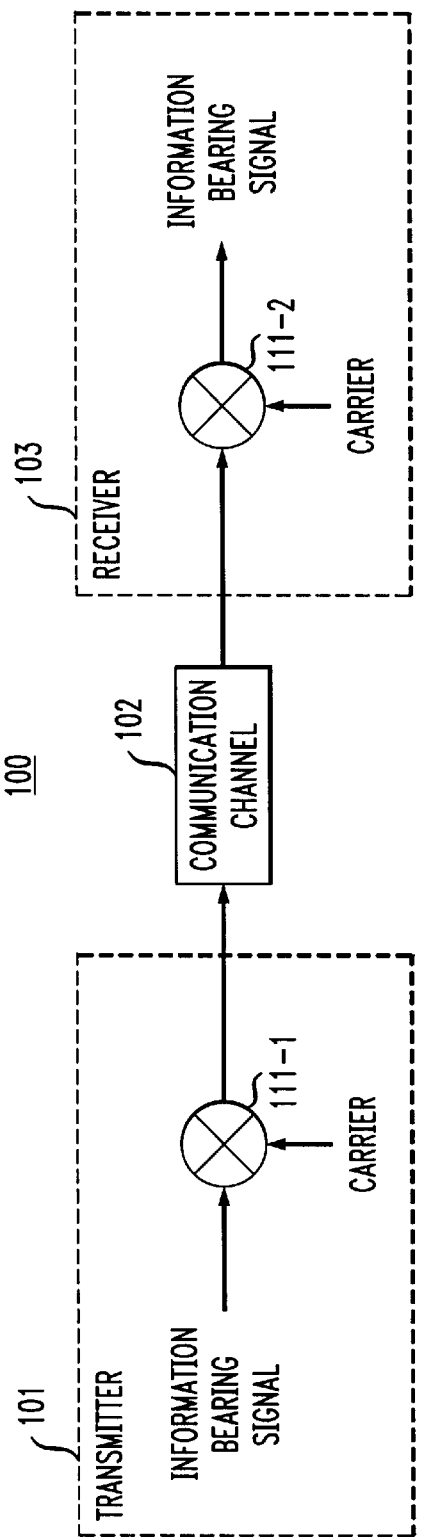
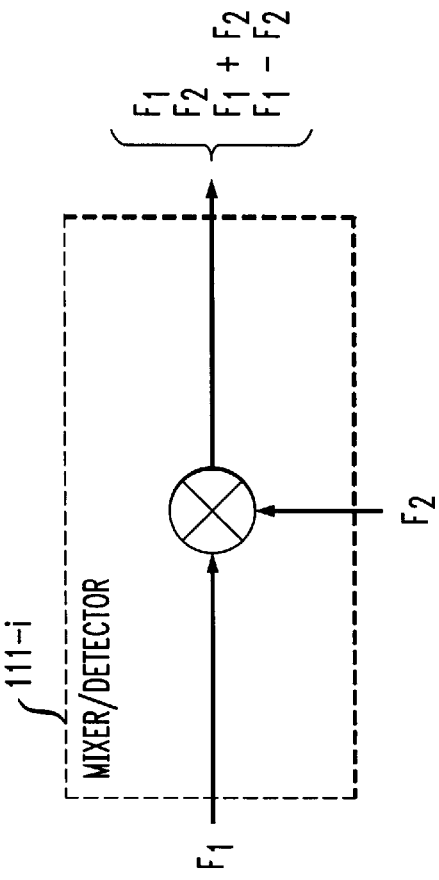

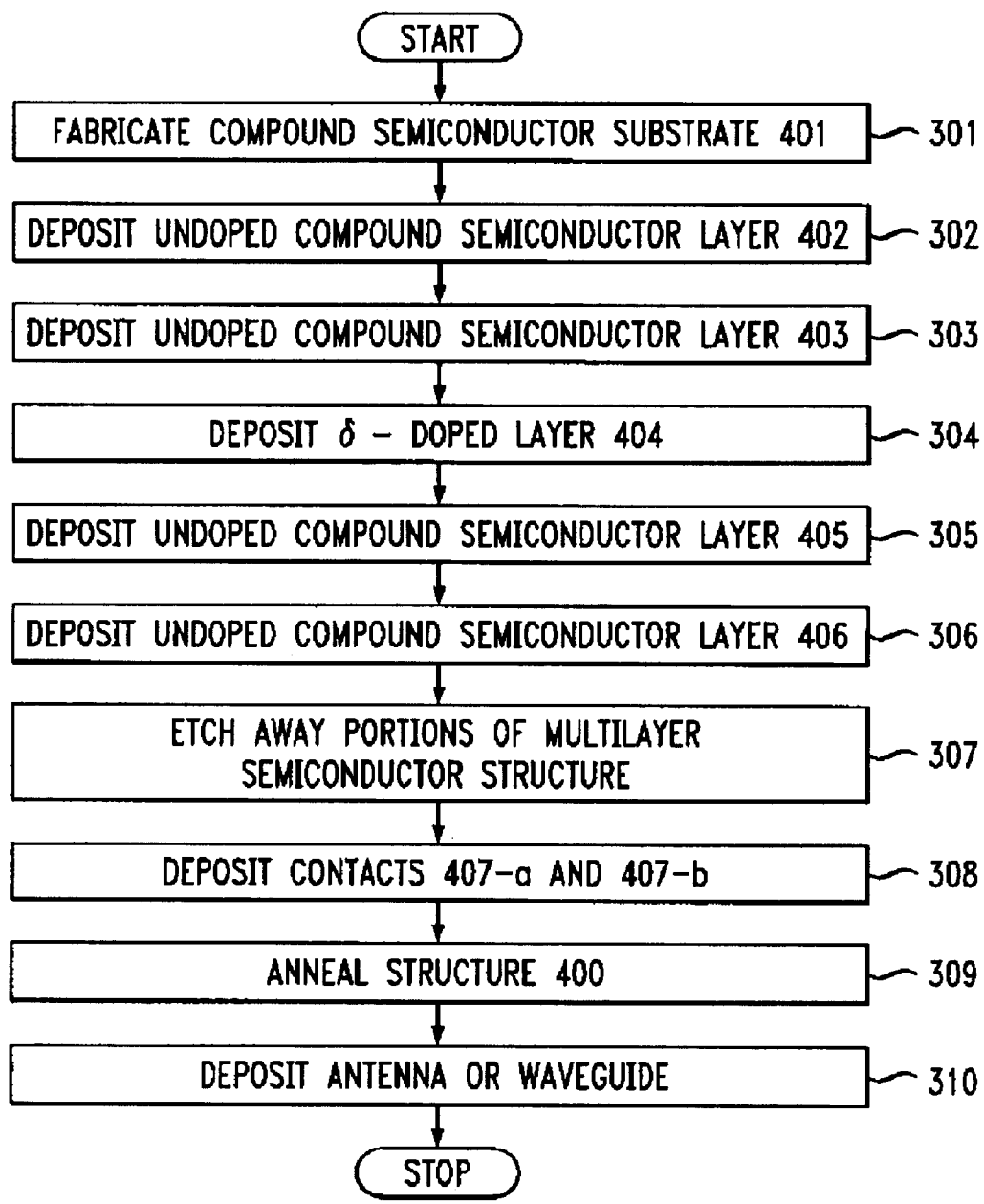

FIG. 4
400
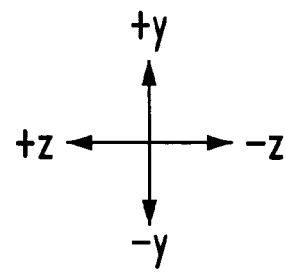
END VIEW ALONG CUT I
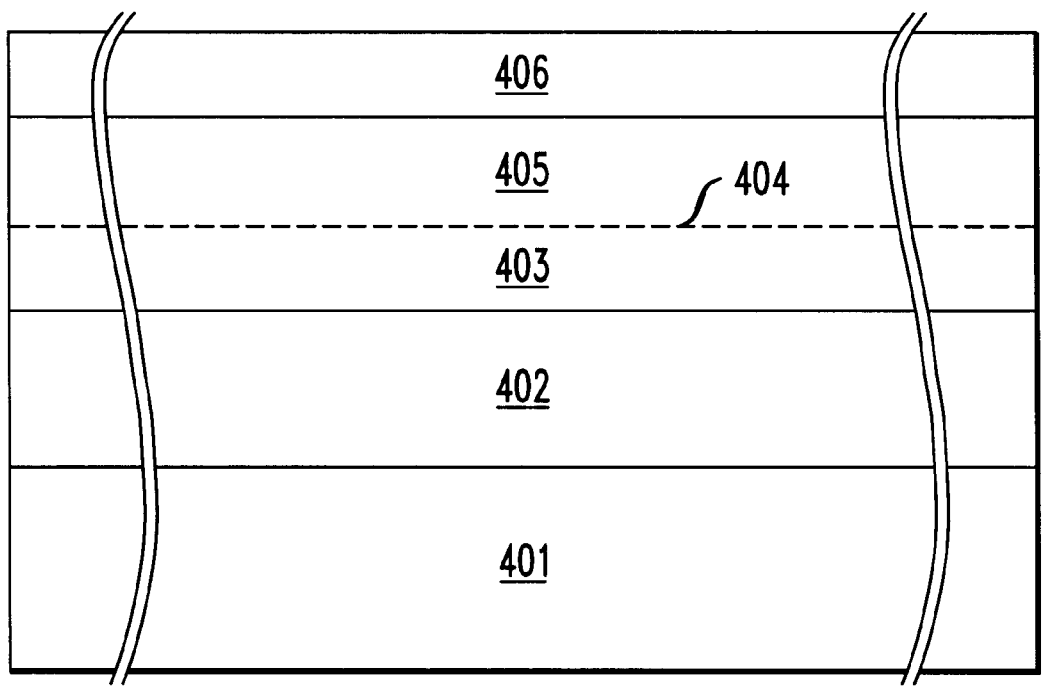

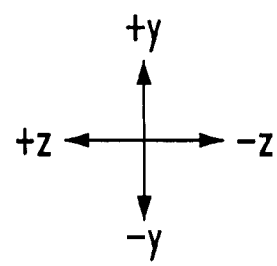
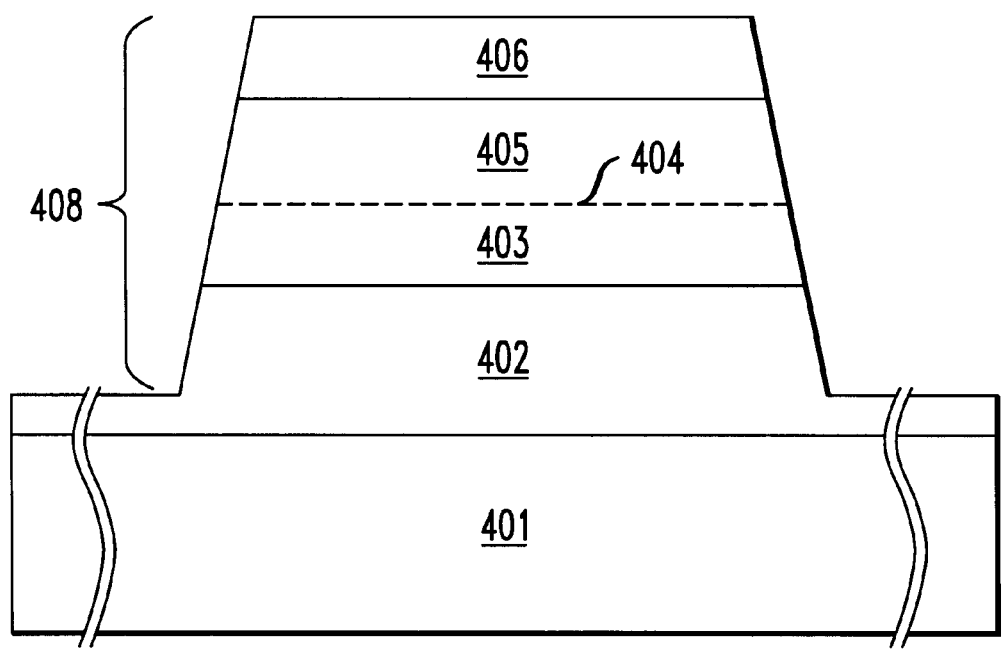
FIG. 5

400

400

FIG. 9
400
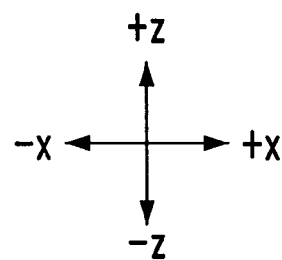
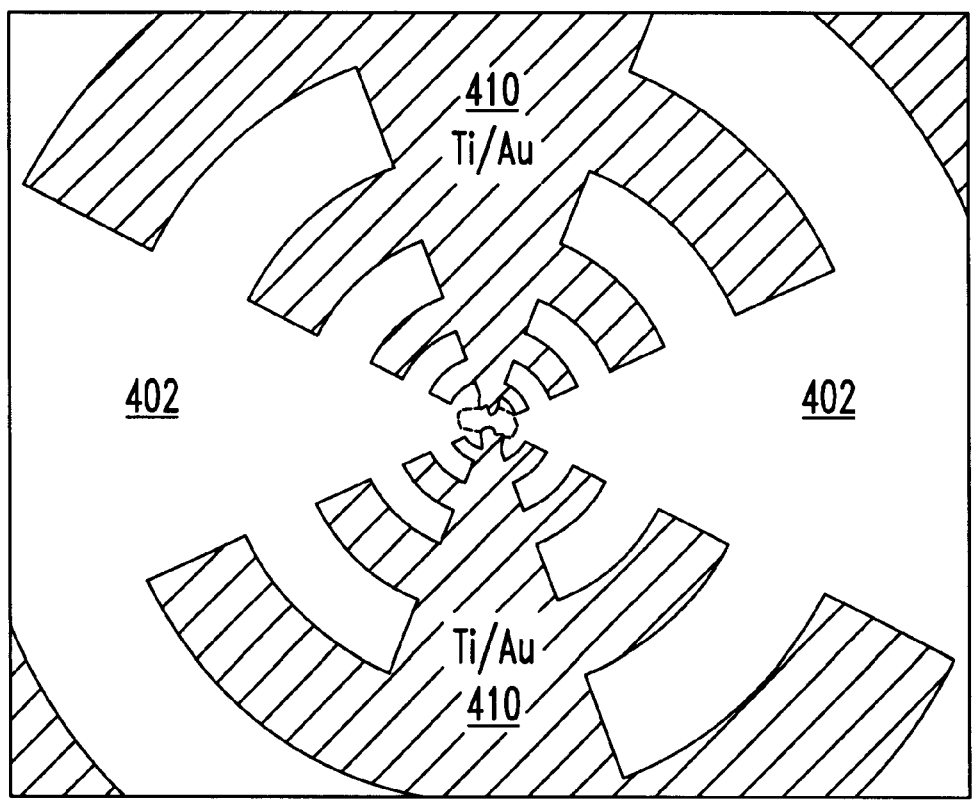

VELOCITY-COOLED HOT-ELECTRON BOLOMETRIC MIXER/DETECTOR

FIELD OF THE INVENTION

The present invention relates to an integrated circuit device for processing signals in general, and, more particularly, to an integrated circuit device that functions as a wideband mixer/detector for microwave to millimeter wave signals.

BACKGROUND OF THE INVENTION

One of the most important, most widely deployed, and most well-known techniques in telecommunications is that of heterodyning. In accordance with heterodyning an information-bearing signal at baseband frequency is shifted into another frequency band, which is usually much higher than the baseband frequency. The ability to shift an information-bearing signal's frequency is useful for two reasons. First, heterodyning enables multiple information-bearing signals at the same baseband frequency to be frequency-division multiplexed on a single communications channel. This is essential for ensuring the efficient bandwidth utilization of the communications channel. Second, heterodyning enables an information-bearing signal to be efficiently transmitted in the physical-limited passband of a communications channel (e.g., radio, optical fiber, etc.). In other words, heterodyning enables a frequency-shifted version of an information-bearing signal to be transmitted in the passband of a communications channel when the baseband version of the signal is outside of the passband.

FIG. 1 depicts a block diagram of a typical telecommunications system in the prior art that illustrates the process of heterodyning. In transmitter 101, an information-bearing signal at one frequency, $F_1$, is used to modulate a carrier signal at a second frequency, $F_2$, which results in the generation of a lower sideband signal at a third frequency, $|F_1-F_2|$, and an upper sideband at a fourth frequency $|F_1+F_2|$. Typically, the frequency of the carrier signal, $F_2$, is much larger than $F_1$ and is carefully chosen so that the frequency of both the upper and lower sidebands are within the passband of communications channel 102. The modulated carrier signal is then transmitted via communications channel 102, which can be either wireless or wireline, to receiver 103. In receiver 103, the modulated carrier signal is demodulated to recover the information-bearing signal.

Interestingly, both the process of modulating the carrier signal (at the transmitter) and the inverse process of demodulating the modulated carrier signal (at the receiver) can be performed with the same device operating in the same fashion. In other words, the process of modulating the carrier signal and the inverse process of demodulating the modulated carrier signal are involutory (i.e., the function f(x) is involutory if, and only if, f(f(x))=x).

When the device is used for modulating, it is often called a "mixer" because the modulation of the carrier is often conceived of as mixing the information-bearing signal with the carrier. When the device is used for demodulating, it is often called a "detector" because the device effectively detects the information-bearing signal within the modulated carrier signal. In contrast, some practitioners call the device a mixer when it is both modulating a carrier and when it is demodulating a carrier. For the purposes of this specification, the device itself, out-of-context, is called a "mixer/detector."

FIG. 2 depicts the process performed by a "mixer/detector" when the device is used for both modulating and demodulating. Two signals, one at frequency $F_1$ and the second at frequency $F_2$ are fed into the device, which because of its inherent physical properties creates four signals: $F_1$, $F_2$, $F_1-F_2$, and $F_1+F_2$. When the device is used for mixing (i.e., modulation), then the signal $F_1$ is filtered out. In contrast, when the device is used for detecting (i.e., demodulation), the process is the same. To illustrate this, let the arriving modulated carrier at the receiver have a frequency of $F_3=F_1-F_2$ and the second input signal to the detector be the carrier signal at frequency $F_2$. Then the output of the mixer/detector are the four signals: $F_2$, $F_3$, $F_2-F_3$, and $F_2+F_3$. Substituting for $F_3=F_1-F_2$, the output signals are: $F_1$, $F_2$, $F_1-F_2$, and $F_1+F_2$. The three signals $F_2$, $F_1-F_2$, and $F_1+F_2$ can be filter out with a bandpass filter to leave the information-bearing signal at $F_1$.

A mixer/detector has several operating characteristics:

1. it operates over a wide range of frequencies;
2. it has a wide modulation bandwidth;
3. it requires a low local oscillator power;
4. it has a high conversion gain;
5. it has a low noise figure;
6. it has resistive electrical characteristics; and
7. it operates at ambient or relatively high temperatures.

There are several mixer/detectors in the prior art that are responsive to millimeter and submillimeter waves. These include Schottky diodes, superconducting insulating superconductor ("SIS") junction mixer/detectors, lattice-cooled bolometric mixer/detectors, and diffusion-cooled bolometric mixer/detectors. K. S. Yngvesson, *Ultrafast Two-Dimension Electron Gas Detector and Mixer for Terahertz Radiation*, Applied Physics Letters, Vol. 76, No. 6, pp. 777–779 (Feb. 7, 2000) provides a discussion of diffusion-cooled bolometric mixers.

For the purposes of this specification, a "diffusion-cooled bolometric mixer/detector" is defined as a mixer/detector whose predominant method of cooling electrons is by transferring, through diffusion, the hot electrons into the mixer/detector's contacts. For the purposes of this specification, a "lattice-cooled bolometric mixer/detector" is defined as a mixer/detector whose predominant method of cooling electrons is by transferring the energy in the hot electrons into phonons that vibrate the lattice of the mixer/detector. Because all of the mixer/detectors in the prior art exhibit at least some disadvantages, the need exists for a mixer/detector that overcomes some of these disadvantages.

SUMMARY OF THE INVENTION

The present invention provides a structure that is useable as a mixer or as a detector or both. In particular, the illustrative embodiment of the present invention is a velocity-cooled hot-electron bolometric mixer/detector, which for the purposes of this specification is defined as a mixer/detector whose predominant method of cooling electrons is by transferring without scattering the hot electrons into the mixer/detector's contacts.

In one aspect, the invention comprises: a compound semiconductor substrate comprising at least one element from group 3 of the periodic table of the elements and at least one element from group 5 of the periodic table of the elements; a first undoped compound semiconductor layer deposited on the compound semiconductor substrate, wherein the first undoped compound semiconductor comprises at least one element from group 3 of the periodic table of the elements and at least one element from group 5 of the periodic table of the elements; a second undoped compound semiconductor layer deposited on the first undoped compound semiconductor layer, wherein the second undoped compound semiconductor comprises at least one element from group 3 of the periodic table of the elements and at least one element from group 5 of the periodic table of the elements, and wherein the second undoped compound semiconductor layer has a wider band gap than the first undoped compound semiconductor layer; and a third layer deposited on the second undoped compound semiconductor layer, wherein the third layer comprises at least one element from group 4 of the periodic table of the elements.

BRIEF DESCRIPTION OF THE DRAWINGS

FIG. 1 depicts a block diagram of a telecommunications system in the prior art.

FIG. 2 depicts a block diagram of a mixer/detector in the prior art.

FIG. 3 depicts a flowchart of the tasks involved in fabricating a mixer/detector in accordance with the illustrative embodiment of the present invention.

FIG. 4 depicts an end view of an integrated circuit structure as fabricated in accordance with tasks 301 through 306 of FIG. 3.

FIG 5 depicts an end view of a mesa structure as fabricated in accordance with tasks 301 through 307 of FIG. 3.

FIG. 9 depicts a top view of a mixer/detector in accordance with the illustrative embodiment of the present invention.

DETAILED DESCRIPTION

Figure 6:
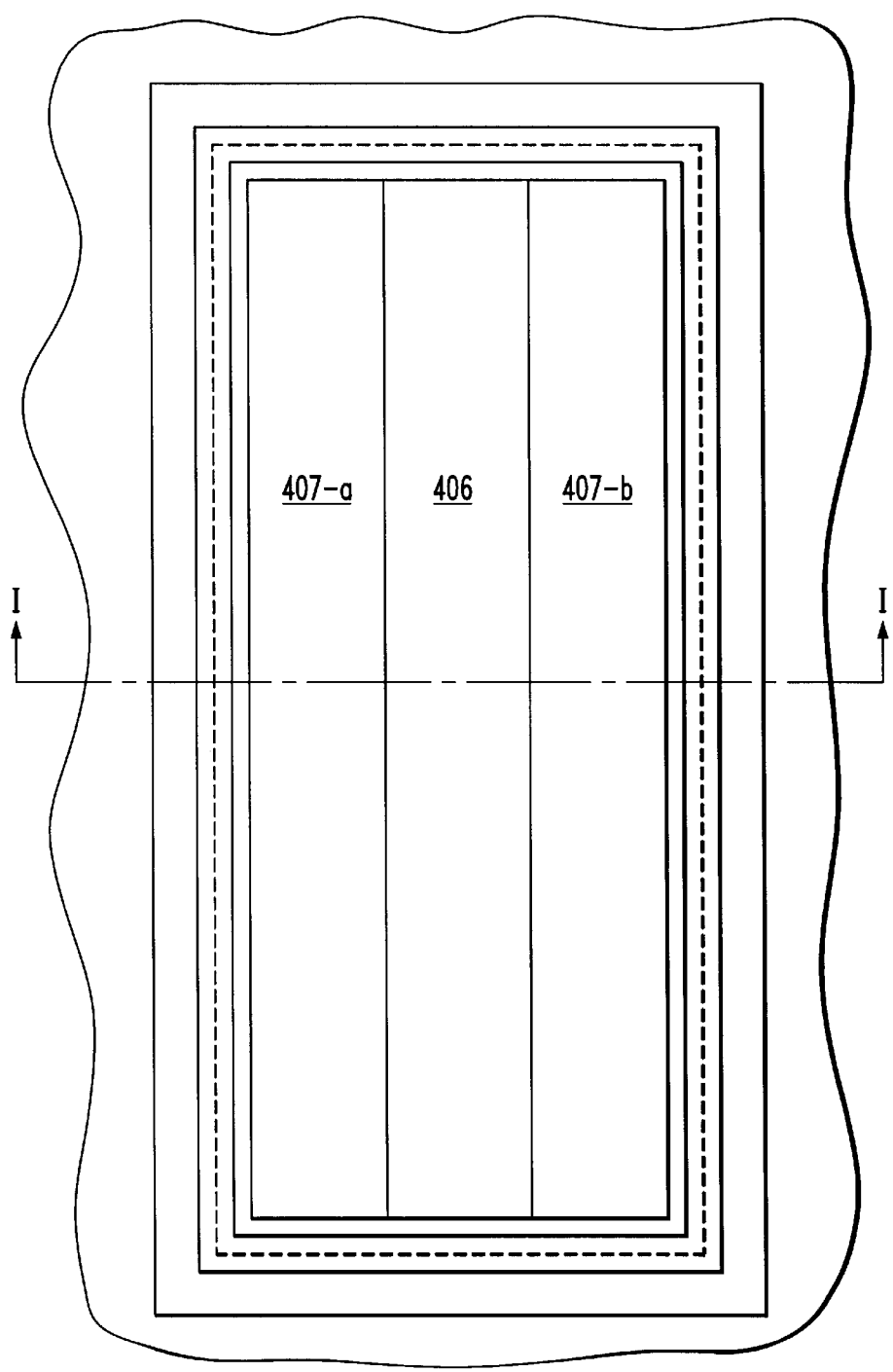
FIG. 6 depicts a top view of a mesa structure as fabricated in accordance with tasks 301 through 307 of FIG. 3.

The illustrative embodiment of the present invention is a hot-electron bolometric mixer/detector whose hot electrons are "velocity-cooled" rather than "diffusion-cooled" or "phonon-cooled" like hot-electron bolometric mixer/detectors in the prior art. The illustrative embodiment is velocity-cooled in the sense that the motion of the hot electrons in the channel is more accurately modeled by their velocity than in accordance with diffusion models. The motion of hot electrons in the channel is more accurately modeled by their velocity when the elastic mean-free path of the hot electrons is greater than the channel length, L, of the mixer/detector. Because the elastic mean-free path of the hot electrons is greater than the channel length, L, of the mixer/detector, some embodiments of the present invention have more advantageous operating characteristics than mixer/detectors in the prior art. For example, some embodiments of the present invention will operate at room temperature when the electron mobility is large and the channel length, L, is small.

FIG. 3 depicts a flowchart of the tasks involved in fabricating a mixer/detector in accordance with the illustrative embodiment of the present invention.

At task 301, compound undoped crystalline semiconductor substrate 401 is fabricated in well-known fashion. Compound undoped crystalline semiconductor substrate 401 comprises at least one element from group 3 of the periodic table of the elements and at least one element from group 5 of the periodic table of the elements. In the illustrative embodiments, compound undoped crystalline semiconductor substrate 401 is gallium-arsenide ("GaAs") or indium-phosphide ("InP"). In the illustrative embodiment, compound undoped crystalline semiconductor substrate 401 has a dimension of approximately 2 inches in diameter in the x-z plane and is 10 to 12 mils thick. It will be clear to those skilled in the art how to make and use compound undoped crystalline semiconductor substrate 401.

At task 302, crystalline undoped compound semiconductor layer 402 is deposited uniformly onto compound undoped crystalline semiconductor substrate 401. Undoped compound semiconductor substrate layer 402 advantageously comprises at least one element from group 3 of the periodic table of the elements and at least one element from group 5 of the periodic table of the elements. In the illustrative embodiments, crystalline undoped compound semiconductor layer 402 is gallium-arsenide ("GaAs") or indium-gallium-arsenide ("InGaAs"). The layer of crystalline undoped compound semiconductor layer 402 is 4.1 microns thick and is deposited with molecular beam epitaxy. It will be clear to those skilled in the art how to deposit crystalline undoped compound semiconductor layer 402 onto compound undoped crystalline semiconductor substrate 401.

At task 303, undoped compound semiconductor layer 403 is deposited onto crystalline undoped compound semiconductor layer 402. Undoped compound semiconductor layer 403 comprises at least one element from group 3 of the periodic table of the elements and at least one element from group 5 of the periodic table of the elements. Furthermore, undoped compound semiconductor layer 403 has a wider band gap than crystalline undoped compound semiconductor layer 402. In the illustrative embodiment, undoped compound semiconductor layer 403 is aluminum-gallium-arsenide ("AlGaAs") in molar percentage $Al_{0.666}Ga_{0.333}As$. The layer of undoped compound semiconductor layer 403 is 800 Angstroms thick and is deposited with molecular beam epitaxy. It will be clear to those skilled in the art how to deposit undoped compound semiconductor layer 403 onto crystalline undoped compound semiconductor layer 402.

At task 304, δ-doping layer 404 is deposited onto undoped compound semiconductor layer 403. δ-doping layer 404 comprises at least one element from group 4 of the periodic table of the elements. Furthermore, δ-doping layer 404 is a mono layer (i.e., is no more than one atom thick) and is deposited with molecular beam epitaxy. In the illustrative embodiment, δ-doping layer 404 is silicon. It will be clear to those skilled in the art how to deposit δ-doping layer 404 onto undoped compound semiconductor layer 403.

At task 305, undoped compound semiconductor layer 405 is deposited onto δ-doping layer 404. Undoped compound semiconductor layer 405 comprises at least one element from group 3 of the periodic table of the elements and at least one element from group 5 of the periodic table of the elements. In the illustrative embodiment, undoped compound semiconductor layer 405 is aluminum-gallium-arsenide ("AlGaAs"). The layer of undoped compound semiconductor layer 405 is 1000 Angstroms thick and is deposited with molecular beam epitaxy. It will be clear to those skilled in the art how to deposit undoped compound semiconductor layer 405 is deposited onto δ-doping layer 404.

At task 306, undoped compound semiconductor layer 406 is deposited onto undoped compound semiconductor layer 405. Undoped compound semiconductor substrate layer 406 comprises at least one element from group 3 of the periodic table of the elements and at least one element from group 5 of the periodic table of the elements. Furthermore, undoped compound semiconductor substrate layer 406 has a narrower band gap than undoped compound semiconductor layer 405. In the illustrative embodiments, undoped compound semiconductor layer 406 is gallium-arsenide ("GaAs") or indium-gallium-arsenide ("InGaAs"). The layer of undoped compound semiconductor layer 406 is 100 Angstroms thick and is deposited with molecular beam epitaxy in molar percentage $Al_{0.666}Ga_{0.333}As$ or $In_{0.666}Ga_{0.333}As$.

It will be clear to those skilled in the art how to deposit undoped compound semiconductor layer 406 onto undoped compound semiconductor layer 405.

After task 306, a structure has the form depicted in end view in FIG. 4.

At task 307, undoped compound semiconductor layer 406, undoped compound semiconductor layer 405, δ-doping layer 404, undoped compound semiconductor layer 403, and at least a portion of crystalline undoped compound semiconductor layer 402 are etched away by standard photolithography and acid etch to leave a mesa as shown in end view in FIG. 5. Advantageously, the mesa has size of 50 microns in the x-dimension and 20 microns in the z-dimension.

Figure 7:
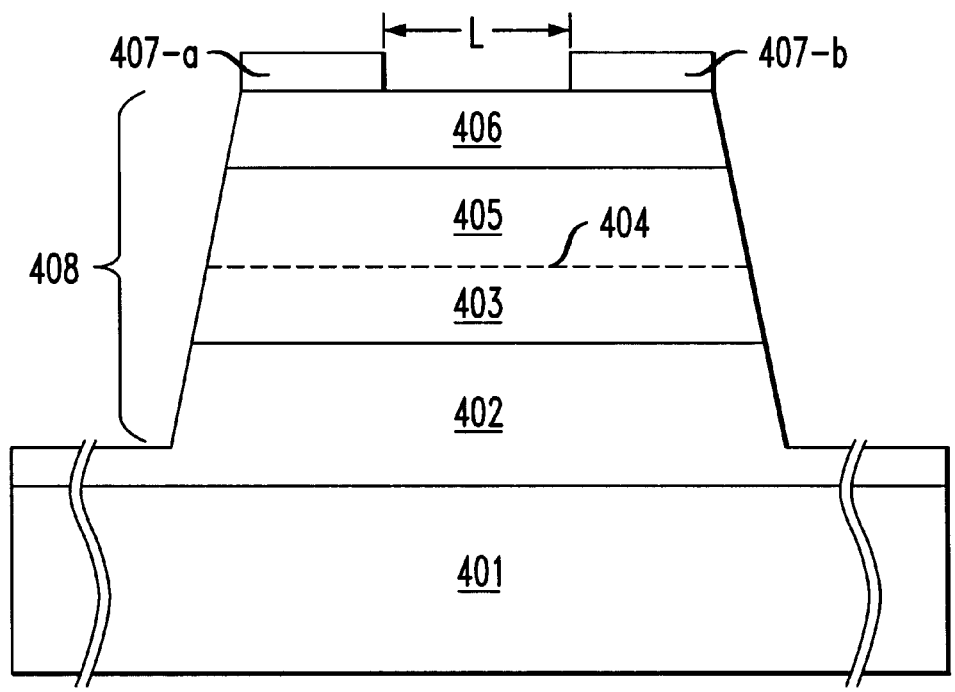
FIG. 7 depicts an end view of a mesa structure as fabricated after task 308 of FIG. 3.

At task 308, two regions of nickel-gold-germanium ("NiAuGe"), ohmic contact 407-a and ohmic contact 407-b, are deposited onto the mesa as shown in top view in FIG. 6 and in cross-section in FIG. 7. Advantageously, each of ohmic contact 407-a and ohmic contact 407-b cover the entire width (the x-dimension) of mesa 408 and extend from the edge of the mesa to a gap (the z-dimension), which is the channel length, L, of the mixer/detector. When the mean-free path of the conduction electrons trapped near the boundary between crystalline undoped compound semiconductor layer 402 and undoped compound semiconductor layer 403, $l_\mu$, is greater than the channel length, L, between ohmic contact 407-a and ohmic contact 407-b, then the motion of the electrons is ballistic. Then, the operation of the device is more accurately modeled by the speed or velocity of the electrons than in accordance with diffusion models for electron propagation. In the illustrative embodiment, the channel length is equal to 0.1 microns. It will be clear to those skilled in the art how to make deposit ohmic contact 407-a and ohmic contact 407-b.

At task 309, structure 400 is annealed in a nitrogen atmosphere at a maximum temperature of 500° C. for ten minutes to drive the nickel-gold-germanium of ohmic contact 407-a and ohmic contact 407-b down at least to the crystalline undoped compound semiconductor layer 402. It will be clear to those skilled in the art how to anneal structure 400.

Figure 8:
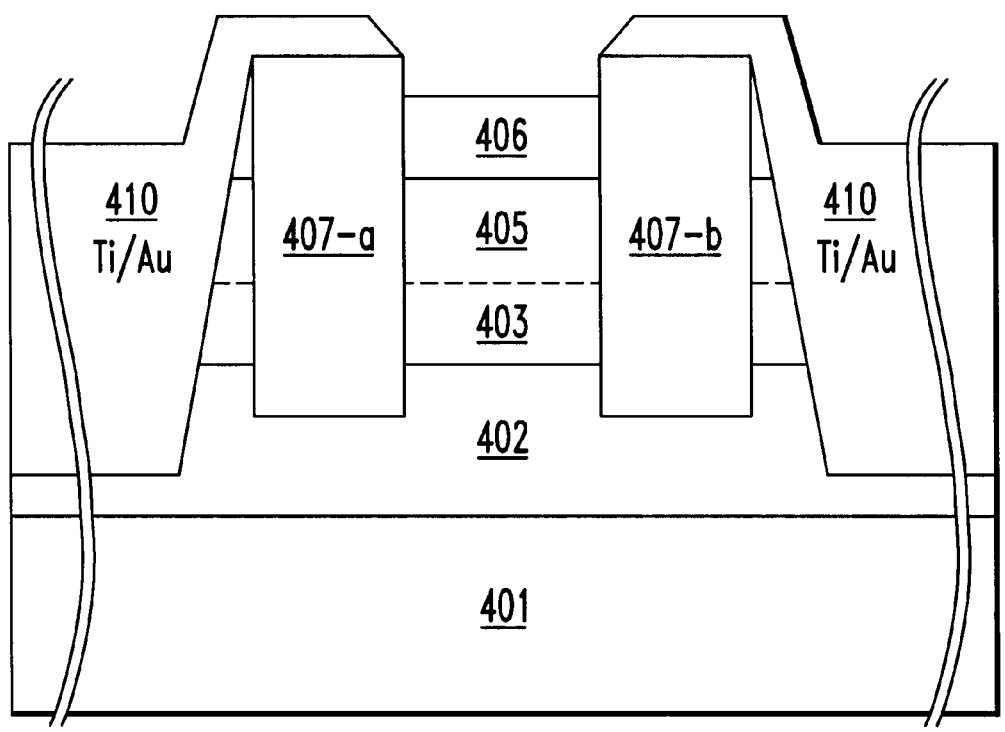
FIG. 8 depicts an end view of a mixer/detector in accordance with the illustrative embodiment of the present invention.

At task 310, titanium-gold layer 410 is deposited to form a waveguide or an antenna, such as a wide-band log-periodic antenna, with the foci of each portion of the waveguide or antenna in contact with one of ohmic contact 407-a and ohmic contact 407-b. FIG. 8 depicts an end view of the complete mixer/detector and FIG. 9 depicts a top view of the complete mixer/detector, which shows in detail the log periodic antenna. It will be clear to those skilled in the art how to deposit the titanium-gold layer and to determine the pattern of wideband log-periodic antenna 302.

After task 310 is completed, the illustrative embodiment is capable of functioning as a mixer or as a detector or as both. The operation of the illustrative embodiment is as follows. A low-voltage (e.g., less than 50 millivolts) DC voltage is established across ohmic contact 407-a and ohmic contact 407-b. Then the two high-frequency input signals, $F_1$ and $F_2$, are fed into the device optically, in free space, and from a direction that is orthogonal to the plane of the waveguide or antenna. The output signals, $F_1$, $F_2$, $F_1-F_2$, and $F_1+F_2$, are manifested as modulations of the low-voltage DC voltage established across ohmic contact 407-a and ohmic contact 407-b.

The illustrative embodiment transports, without scattering, charge carriers between the contacts at temperatures above about 77° Kelvin and above about 295° Kelvin.

Figure 10:
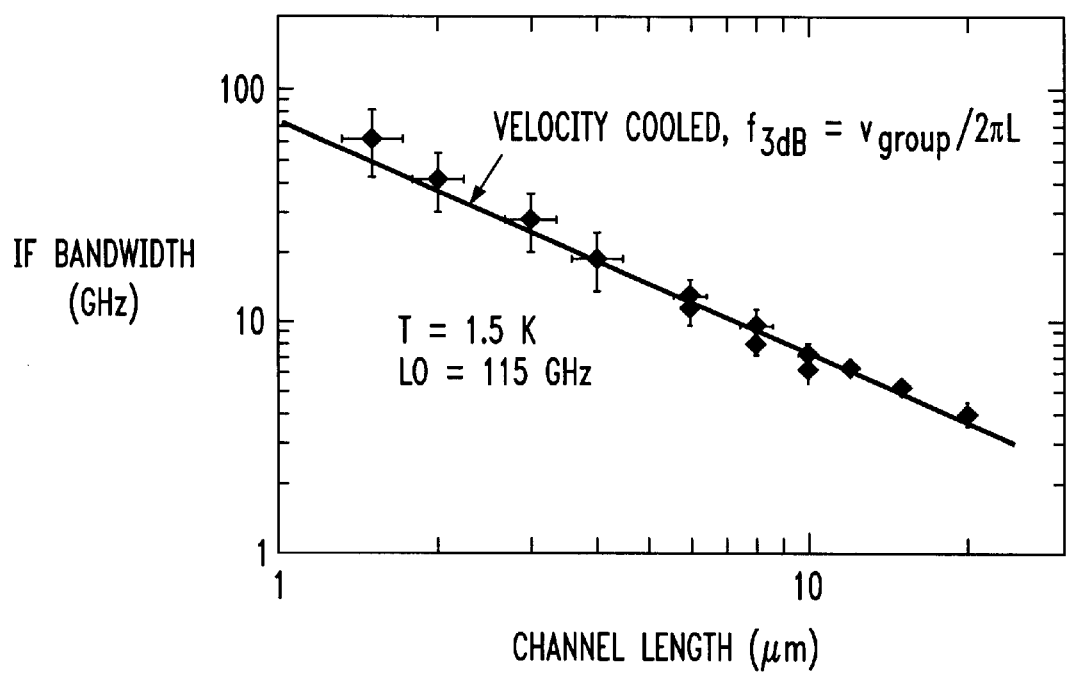
FIG. 10 depicts a graph of the bandwidth of the illustrative embodiment as a function of the channel length, L.

FIG. 10 depicts a graph of the operation of the illustrative embodiment that indicates that the cooling of the electrons in the illustrative embodiment is more accurately modeled by velocity than by diffusion or lattice vibration. This is because the relationship of the log of the bandwidth of a device to the log of the channel length of the device indicates how the electrons in the device are cooled.

If the log of the bandwidth of the device is independent of the log of the channel length of the device, then the cooling of the electrons is most accurately modeled by lattice vibration (i.e., the device is a lattice-cooled bolometric detector/mixer).

If the log of the bandwidth of the device varies with the −2 power of the log of the channel length of the device, then the cooling of the electrons is most accurately modeled by diffusion (i.e., the device is a diffusion-cooled bolometric detector/mixer).

If the log of the bandwidth of the device varies with the −1 power of the log of the channel length of the device, then the cooling of the electrons is most accurately modeled by velocity (i.e., the device is a velocity-cooled bolometric detector/mixer). Because the log of the bandwidth of the illustrative embodiment varies with the −1 power of the log of the channel length, as shown in FIG. 10, the cooling of the electrons in the illustrative embodiment is most accurately modeled by velocity.

It is to be understood that the above-described embodiments are merely illustrative of the present invention and that many variations of the above-described embodiments can be devised by those skilled in the art without departing from the scope of the invention. It is therefore intended that such variations be included within the scope of the following claims and their equivalents.

What is claimed is:

1. A multilayer semiconductor structure comprising:
    a first undoped compound semiconductor layer comprising at least one element from group 3 of the periodic table of the elements and at least one element from group 5 of the periodic table of the elements;
    a second undoped compound semiconductor layer adjacent to said first undoped compound semiconductor layer, wherein said second undoped compound semiconductor comprises at least one element from group 3 of the periodic table of the elements and at least one element from group 5 of the periodic table of the elements, and wherein said second undoped compound semiconductor layer has a wider band gap than said first undoped compound semiconductor layer;
    a third layer adjacent to said second undoped compound semiconductor layer, wherein said third layer comprises at least one element from group 4 of the periodic table of the elements;
    a first ohmic contact that penetrates said third layer and said second undoped compound semiconductor layer, and makes contact with said first undoped compound semiconductor layer; and a second ohmic, contact spaced by a channel length L from the first ohmic contact, that penetrates said third layer and said second undoped compound semiconductor layer, and makes contact with said first undoped compound semiconductor layer;

wherein an elastic mean-free path of conduction charge carriers at a boundary between said first undoped compound semiconductor layer and said second undoped compound semiconductor layer, $l_\mu$, is greater than the channel length L.

2. The multilayer semiconductor structure of claim 1 wherein said first ohmic contact comprises nickel-gold-germanium.

3. The multilayer semiconductor structure of claim 1 wherein said third layer is substantially one atomic layer thick.

4. The multilayer semiconductor structure of claim 1 wherein said third layer comprises silicon.

5. The multilayer semiconductor structure of claim 1 in which said first undoped compound semiconductor layer comprises at least one member selected from the group consisting of gallium-arsenide and indium-gallium-arsenide.

6. The multilayer semiconductor structure of claim 1 further comprising: a compound semiconductor substrate on which said first undoped compound semiconductor layer is deposited, comprising at least one element from group 3 of the periodic table of the elements and at least one element from group 5 of the periodic table of the elements.

7. The multilayer semiconductor structure of claim 1 further comprising a fourth undoped compound semiconductor layer adjacent to said third layer, said first and second ohmic contacts penetrating said fourth layer, wherein said fourth undoped compound semiconductor comprises at least one element from group 3 of the periodic table of the elements and at least one element from group 5 of the periodic table of the elements.

8. The multilayer semiconductor structure of claim 1 in which said second undoped compound semiconductor layer comprises aluminum-gallium-arsenide.

9. The multilayer semiconductor structure of claim 1 wherein the elastic mean-free path of conduction charge carriers at said boundary is greater than the channel length L at temperatures above about 77° Kelvin.

10. The multilayer semiconductor structure of claim 1 wherein the elastic mean-free path of conduction charge carriers at said boundary is greater than the channel length L at temperatures above about 295° Kelvin.

11. The multilayer semiconductor structure of claim 1 wherein said boundary transports electrons.

12. The multilayer semiconductor structure of claim 7 further comprising a fifth undoped compound semiconductor layer adjacent to said fourth layer, said first and second ohmic contacts penetrating said fifth layer, wherein said fifth undoped compound semiconductor comprises at least one element from group 3 of the periodic table of the elements and at least one element from group 5 of the periodic table of the elements.

13. The multilayer semiconductor structure of claim 7 in which said fourth undoped compound semiconductor layer comprises aluminum-gallium-arsenide.

14. The multilayer semiconductor structure of claim 6 in which said compound semiconductor substrate comprises at least one member selected from the group consisting of gallium-arsenide and indium-phosphide.

15. The multilayer semiconductor structure of claim 12 in which said fifth undoped compound semiconductor layer comprises at least one member selected from the group consisting of gallium-arsenide and indium-gallium-arsenide.

16. The multilayer semiconductor structure of claim 12 in which said fifth undoped compound semiconductor layer has a narrower band gap than does said fourth undoped compound semiconductor layer.

17. A mixer for modulating or demodulating a signal, said mixer comprising:

a first undoped compound semiconductor layer comprising at least one element from group 3 of the periodic table of the elements and at least one element from group 5 of the periodic table of the elements;

a second undoped compound semiconductor layer adjacent to said first undoped compound semiconductor layer, wherein said second undoped compound semiconductor comprises at least one element from group 3 of the periodic table of the elements and at least one element from group 5 of the periodic table of the elements, and wherein said second undoped compound semiconductor layer has a wider band gap than said first undoped compound semiconductor layer;

a third layer adjacent to said second undoped compound semiconductor layer, wherein said third layer comprises at least one element from group 4 of the periodic table of the elements;

a first ohmic contact that penetrates said third layer and said second undoped compound semiconductor layer, and makes contact with said first undoped compound semiconductor layer;

a second ohmic contact, spaced by a channel length L from the first ohmic contact, that penetrates said third layer and said second undoped compound semiconductor layer, and makes contact with said first undoped compound semiconductor layer; and a charge carrier conducting layer having a plurality of foci, each of the foci being in contact with the first ohmic contact or the second ohmic contact;

wherein an elastic mean-free path of conduction charge carriers at a boundary between said first undoped compound semiconductor layer and said second undoped compound semiconductor layer, $l_\mu$, is greater than the channel length L.

18. The mixer of claim 17 wherein charge carriers are transported without scattering between the first and second ohmic contacts at said boundary, at temperatures above about 295° Kelvin.

19. The mixer of claim 17 wherein said boundary transports electrons.

20. The mixer of claim 17 wherein said boundary has a mobility determined mean free path that is greater than said length L.

21. The mixer of claim 17 wherein said length L is about 0.1 microns.

22. The mixer of claim 17 further comprising: a compound semiconductor substrate on which said first undoped compound semiconductor layer is deposited, comprising at least one element from group 3 of the periodic table of the elements and at least one element from group 5 of the periodic table of the elements.

23. The mixer of claim 17 further comprising a fourth undoped compound semiconductor layer adjacent to said third layer, said first and second ohmic contacts penetrating said fourth layer, wherein said fourth undoped compound semiconductor comprises at least one element from group 3 of the periodic table of the elements and at least one element from, group 5 of the periodic table of the elements.

24. The mixer of claim 17 further comprising a fifth undoped compound semiconductor layer adjacent to said fourth layer, said first and second ohmic contacts penetrating said fifth layer, wherein said fifth undoped compound semiconductor comprises at least one element from group 3 of the periodic table of the elements and at least one element from group 5 of the periodic table of the elements.

25. The mixer of claim 17 wherein charge carriers are transported without scattering between the first and second ohmic contacts at said boundary, at temperatures above about 77° Kelvin.

26. The mixer of claim 17 in which said charge carrier conducting layer is an antenna.

27. The mixer of claim 17 in which said charge carrier conducting layer is a waveguide.

28. The mixer of claim 24 in which said fifth undoped compound semiconductor layer has a narrower band gap than does said fourth undoped compound semiconductor layer.

* * * * *